US006992934B1

(12) United States Patent
Sarin et al.

(10) Patent No.: US 6,992,934 B1
(45) Date of Patent: Jan. 31, 2006

(54) READ BITLINE INHIBIT METHOD AND APPARATUS FOR VOLTAGE MODE SENSING

(75) Inventors: Vishal Sarin, Cupertino, CA (US); Hieu Van Tran, San Jose, CA (US); Jack Frayer, Boulder Creek, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/080,595

(22) Filed: Mar. 15, 2005

(51) Int. Cl.
*G11C 16/08* (2006.01)

(52) U.S. Cl. .......................... 365/185.23; 365/185.03; 365/185.02

(58) Field of Classification Search ........... 365/185.03, 365/185.02, 185.09, 185.23
See application file for complete search history.

(56) References Cited

U.S. PATENT DOCUMENTS

| | | | | |
|---|---|---|---|---|
| 5,774,398 | A * | 6/1998 | Ishida | 365/185.11 |
| 6,208,559 | B1 * | 3/2001 | Tu et al. | 365/185.18 |
| 6,282,145 | B1 | 8/2001 | Tran et al. | 365/230.06 |
| 2005/0024956 | A1 | 2/2005 | Tran et al. | 365/200 |

* cited by examiner

*Primary Examiner*—Andrew Q. Tran
(74) *Attorney, Agent, or Firm*—DLA Piper Rudnick Gray Cary US LLP

(57) ABSTRACT

A multilevel memory system uses a source line driver circuit and a read bitline inhibit driver circuit to eliminate inhibit offset currents on unselected bitlines before memory operations of selected memory cells to equalize voltages before the operation.

4 Claims, 8 Drawing Sheets

READ BITLINE INHIBIT METHOD AND APPARATUS FOR VOLTAGE MODE SENSING

BACKGROUND

The present invention relates to memory systems, and more particularly to read bitline inhibit during multilevel cell voltage mode sensing.

Memory systems include memory arrays that include a plurality of memory cells arranged in rows and columns. Row of memory cells are coupled to corresponding source lines which are selected by decoder circuitry. Columns of memory cells are coupled to corresponding bitlines which are used for reading the content of the selected row of memory cells. Resistances on the source line and capacitances on the bitline create local source line voltage offsets. In some instances, the offsets may create a data pattern dependency for reading of the multilevel memory cells.

SUMMARY

The memory system comprises a memory array, a source line driver circuit, and a read bitline inhibit circuit. The memory array includes a plurality of memory cells arranged in rows and columns, a plurality of source lines, and a plurality of bitlines. Each of the plurality of source lines is coupled to a corresponding row of memory cells. Each of the plurality of bitlines is coupled to a corresponding column of memory cells. The source line driver circuit drives a selected source line to apply a control voltage to the selected source line for a memory operation. The read bitline inhibit circuit drives a plurality of bitlines to apply an inhibit offset voltage to unselected bitlines during memory operations.

DETAILED DESCRIPTION

A memory array system generates a read bitline inhibit voltage on unselected bitlines to match voltages on source lines. This may reduce local source line voltage offsets introduced by inhibit current offset loops, and may reduce or eliminate data pattern dependency for multilevel cell reads.

Figure 1:
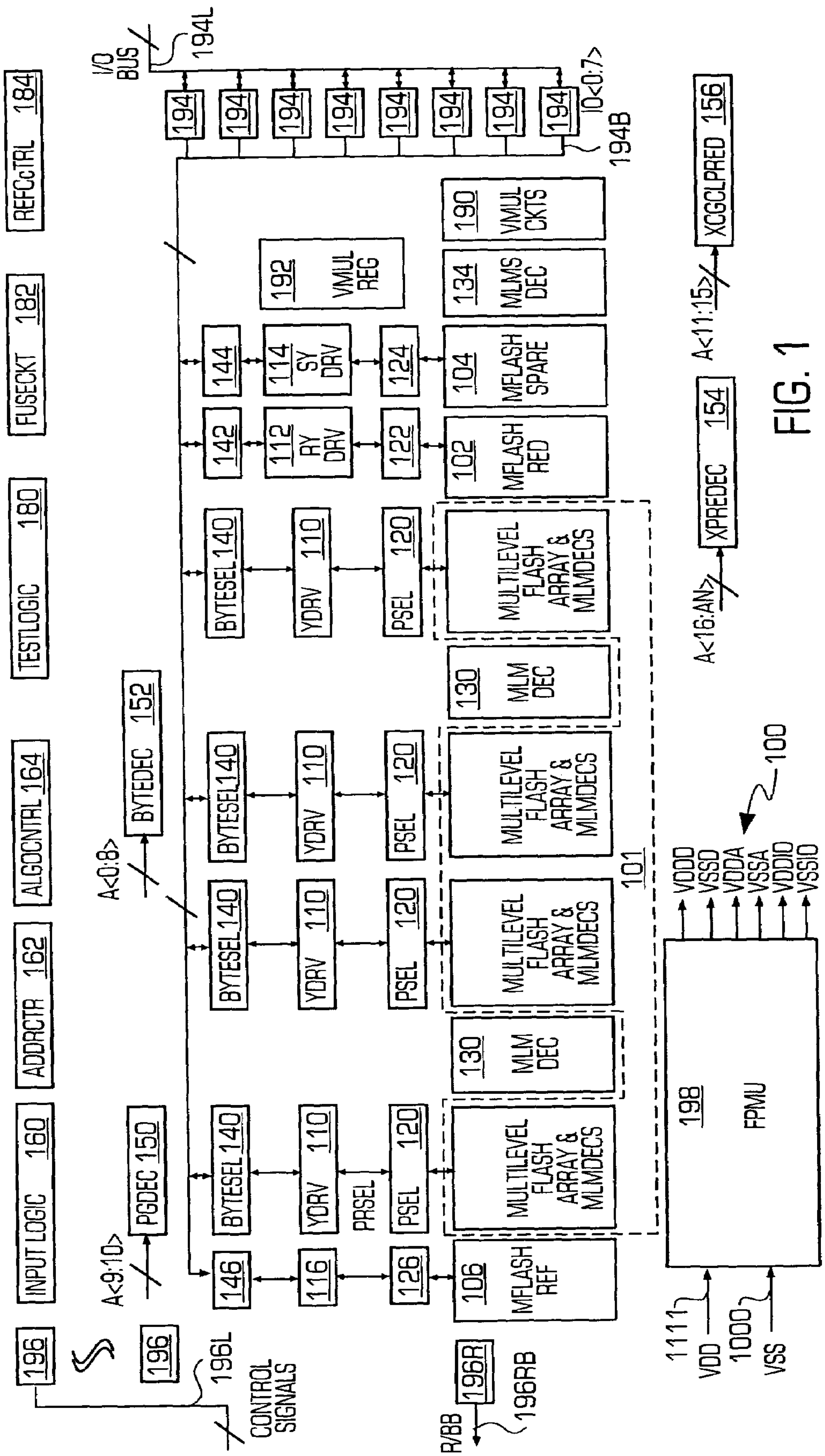
FIG. 1 is a block diagram illustrating a digital multilevel memory data storage system.

FIG. 1 is a block diagram illustrating a digital multilevel bit memory array system 100. For clarity, some signal lines of the memory array system 100 are not shown in FIG. 1.

In one embodiment, the memory array includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The digital multilevel bit memory array system 100 includes a plurality of regular memory arrays 101, a plurality of redundant memory arrays (MFLASHRED) 102, a spare array (MFLASHSPARE) 104, and a reference array (MFLASHREF) 106. An N-bit digital multilevel cell is defined as a memory cell capable of storing $2^N$ levels.

In one embodiment, the memory array system 100 stores one gigabits of digital data with 4-bit multilevel cells, and the regular memory arrays 101 are equivalently organized as 8,192 columns and 32,768 rows. Addresses A<12:26> are used to select a row, and addresses A<0:11> are used to select two columns for one byte. A page is defined as a group of 512 bytes corresponding to 1,024 columns or cells on a selected row. A page is selected by the A<9:11> address. A row is defined here as including 8 pages. A byte within a selected page is selected by the address A<0:8>. Further, for each page of 512 regular data bytes, there are 16 spare bytes that are selected by the address A<0:3>, which are enabled by other control signals to access the spare array and not the regular array as is normally the case. Other organizations are possible such as a page including 1024 bytes or a row including 16 or 32 pages.

The reference array (MFLASHREF) 106 is used for a reference system of reference voltage levels to verify the contents of the regular memory array 101. In another embodiment, the regular memory arrays 101 may include reference memory cells for storing the reference voltage levels.

The redundancy array (MFLASHRED) 102 is used to increase production yield by replacing bad portions of the regular memory array 101.

The spare array (MFLASHSPARE) 104 may be used for extra data overhead storage such as for error correction and/or memory management (e.g., status of a selected block of memory being erased or programmed, number of erase and program cycles used by a selected block, or number of bad bits in a selected block). In another embodiment, the digital multilevel bit memory array system 100 does not include the spare array 104.

The digital multilevel bit memory array system 100 further includes a plurality of y-driver circuits 110, a plurality of redundant y-driver circuits (RYDRV) 112, a spare y-driver circuit (SYDRV) 114, and a reference y-driver (REFYDRV) circuit 116.

The y-driver circuit (YDRV) 110 controls bit lines (also known as columns, not shown in FIG. 1) during write, read, and erase operations. Each y-driver (YDRV) 110 controls one bitline at a time. Time multiplexing may be used so that each y-driver 110 controls multiple bit lines during each write, read, and erase operation. The y-driver circuits (YDRV) 110 are used for parallel multilevel page writing and reading to speed up the data rate during write to and read from the regular memory array 101. In one embodiment, for a 512-byte page with 4-bit multilevel cells, there are a total of 1024 y-drivers 110 or a total of 512 y-drivers 300.

The reference y-driver circuit (REFYDRV) 116 is used for the reference array (MFLASHREF) 106. In one embodiment, for a 4-bit multilevel cell, there are a total of 15 or 16 reference y-drivers 116. The function of the reference y-driver 116 may be similar to that of the y-driver circuit 110.

The redundant y-driver circuit (RYDRV) 112 is used for the redundant array (MFLASHRED) 102. The function of redundant y-driver circuit (RYDRV) 112 may be similar to that of the y-driver circuit (YRDRV) 110.

The spare y-driver circuit (SYDRV) 114 includes a plurality of single spare y-drivers (SYDRV) 114 used for the spare array (MFLASHSPARE) 104. The function of the spare y-driver circuit (SYDRV) 114 may be similar to the function of the y-driver circuit (YDRV) 110. In one embodiment, for a 512-byte page with 4-bit multilevel cells with 16 spare bytes, there are a total of 32 spare y-drivers 114.

The digital multilevel bit memory array system 100 further includes a plurality of page select (PSEL) circuits 120, a redundant page select circuit 122, a spare page select circuit 124, a reference page select circuit 126, a plurality of block decoders (BLKDEC) 130, a multilevel memory precision spare decoder (MLMSDEC) 134, a byte select circuit (BYTESEL) 140, a redundant byte select circuit 142, a spare byte select circuit 144, a reference byte select circuit 146, a page address decoder (PGDEC) 150, a byte address decoder (BYTEDEC) 152, an address pre-decoding circuit (X PREDEC) 154, an address pre-decoding circuit (XCGCLPRE1) 156, an input interface logic (INPUTLOGIC) 160, and an address counter (ADDRCTR) 162.

The page select circuit (PSEL) 120 selects one bit line (not shown) out of multiple bitlines for each single y-driver (YDRV) 110. In one embodiment, the number of multiple bitlines connected to a single y-driver (YDRV) 110 is equal to the number of pages. The corresponding select circuits for the reference array 106, the redundant memory array 102, and the spare memory array 104 are the reference page select circuit 126, the redundant page select circuit 122, and the spare page select circuit 124, respectively.

The byte select circuit (BYTESEL) 140 enables one byte data in or one byte data out of a pair of the y-driver circuits (YDRV) 110 at a time. The corresponding byte select circuits for the reference array 106, the redundant memory array 102, and the spare memory array 104 are the reference byte select circuit 146, the redundant byte select circuit 142, and the spare byte select circuit 144, respectively.

The block decoder (BLKDEC) 130 selects a row or a block of rows in the arrays 101 and 102 based on the signals from the address counter 162 (described below) and provides precise multilevel bias values over temperature, process, and power supply used for consistent single level or multilevel memory operation for the regular memory array 101 and the redundant memory array 102. The multilevel memory precision spare decoder (MLMSDEC) 134 selects a spare row or block of spare rows in the spare array 104 and provides precise multilevel bias values over temperature, process corners, and power supply used for consistent multilevel memory operation for the spare array 104. The intersection of a row and column selects a cell in the memory array. The intersection of a row and two columns selects a byte in the memory array.

The address pre-decoding circuit 154 decodes addresses. In one embodiment, the addresses are A<16:26> to select a block of memory array with one block comprising 16 rows. The outputs of the address pre-decoding circuit 154 are coupled to the block decoder 130 and the spare decoder 134. The address pre-decoding circuit 156 decodes addresses. In one embodiment, the addresses are addresses A<12,15> to select one row out of sixteen within a selected block. The outputs of address pre-decoding circuit 156 are coupled to the block decoder 130 and the spare decoder 134.

The page address decoder 150 decodes page addresses, such as A<9:11>, to select a page, e.g., P<0:7>, and provides its outputs to the page select circuits 120, 122, 124, and 126. The byte address decoder 152 decodes byte addresses, such as A<0:8>, and provides its outputs to the byte select circuit 140 to select a byte. The byte predecoder 152 also decodes spare byte address, such as A<0:3>and AEXT (extension address), and provides its outputs to the spare byte select circuit 144 to select a spare byte. A spare byte address control signal AEXT is used together with A<0:3> to decode addresses for the spare array 104 instead of the regular array The address counter (ADDRCTR) 162 provides addresses A<11:AN>, A<9:10>, and A<0:8> for row, page, and byte addresses, respectively. The outputs of the address counter (ADDRCTR) 162 are coupled to circuits 154, 156, 150, and 152. The inputs of the address counter (ADDRCTR) 162 are coupled from the outputs of the input interface logic (INPUTLOGIC) 160.

The input interface logic circuit (INPUTLOGIC) 160 provides an external interface to external systems, such as an external system microcontroller. Typical external interface for memory operations are read, write, erase, status read, identification (ID) read, ready busy status, reset, and other general purpose tasks. A serial interface can be used for the input interface to reduce pin counts for a high-density chip due to a large number of addresses. Control signals (not shown) couple the input interface logic circuit (INPUTLOGIC) 160 to the external system microcontroller. The input interface. logic circuit (INPUTLOGIC) 160 includes a status register that indicates the status of the memory chip operation such as pass or fail in program or erase, ready or busy, write protected or unprotected, cell margin good or bad, restore or no restore, and the like.

The digital multilevel bit memory array system 100 further includes an algorithm controller (ALGOCNTRL) 164, a band gap voltage generator (BGAP) 170, a voltage and current bias generator (V&IREF) 172, a precision oscillator (OSC) 174, a voltage algorithm controller (VALGGEN) 176, a test logic circuit (TESTLOGIC) 180, a fuse circuit (FUSECKT) 182, a reference control circuit (REFCNTRL) 184, a redundancy controller (REDCNTRL) 186, voltage supply and regulator (VMULCKTS) 190, a voltage multiplexing regulator (VMULREG) 192, input/output (IO) buffers 194, and an input buffer 196.

The algorithm controller (ALGOCNTRL) 164 is used to handshake the input commands from the input logic circuit (INPUTLOGIC) 160 and to execute the multilevel erase, programming and sensing algorithms used for multilevel nonvolatile operation. The algorithm controller (ALGOCNTRL) 164 is also used to algorithmically control the precise bias and timing conditions used for multilevel precision programming.

The test logic circuit (TESTLOGIC) 180 tests various electrical features of the digital circuits, analog circuits, memory circuits, high voltage circuits, and memory array. The inputs of the test logic circuit (TESTLOGIC) 180 are coupled from the outputs of the input interface logic circuit (INPUTLOGIC) 160. The test logic circuit (TESTLOGIC) 180 also provides timing speed-up in production testing such as in faster write/read and mass modes. The test logic circuit (TESTLOGIC) 180 also provides screening tests associated with memory technology such as various disturb and reliability tests. The test logic circuit (TESTLOGIC) 180 also allows an off-chip memory tester to directly take over the control of various on-chip logic and circuit bias circuits to provide various external voltages and currents and external timing. This feature permits, for example, screening with external voltage and external timing or permits accelerated production testing with fast external timing.

The fuse circuit (FUSECKT) 182 is a set of nonvolatile memory cells configured at the external system hierarchy, at the tester, at the user, or on chip on-the-fly to achieve various settings. These settings can include precision bias values, precision on-chip oscillator frequency, programmable logic features such as write-lockout feature for portions of an array, redundancy fuses, multilevel erase, program and read algorithm parameters, or chip performance parameters such as write or read speed and accuracy.

The reference control circuit (REFCNTRL) 184 is used to provide precision reference levels for precision voltage values used for multilevel programming and sensing. The redundancy controller (REDCNTRL) 186 provides redundancy control logic.

The voltage algorithm controller (VALGGEN) 176 provides various specifically shaped voltage signals of amplitude and duration used for multilevel nonvolatile operation and to provide precise voltage values with tight tolerance, used for precision multilevel programming, erasing, and sensing. The bandgap voltage generator (BGAP) 170 provides a precise voltage value over process, temperature, and supply for multilevel programming and sensing.

The voltage and current bias generator (V&IREF) 172 is a programmable bias generator. The bias values are programmable by the settings of control signals from the fuse circuit (FUSECKT) 182 and also by various metal options. The oscillator (OSC) 174 is used to provide accurate timing for multilevel programming and sensing.

The input buffer 196 provides buffers for input/output with the memory array system 100. The input buffer 196 buffers an input/output line 197 coupled to an external circuit or system, and an input/output bus 194B, which couples to the arrays 101, 102, 104, and 106 through the y-drivers 110, 112, 114, and 116, respectively. In one embodiment, the input buffer 196 includes TTL input buffers or CMOS input buffers. In one embodiment, the input buffer 196 includes an output buffer with slew rate control or an output buffer with value feedback control. Input/output (IO) buffer blocks 194 includes typical input buffers and typical output buffers. A typical output buffer is, for example, an output buffer with slew rate control, or an output buffer with level feedback control. A circuit block 196R is an open drained output buffer and is used for ready busy handshake signal (R/RB) 196RB.

The voltage supply and regulator (VMULCKT) 190 provides regulated voltage values above or below the external power supply used for erase, program, read, and production tests. In one embodiment, the voltage supply and regulator 190 includes a charge pump or a voltage multiplier. The voltage multiplying regulator (VMULREG) 192 provides regulation for the regulator 190 for power efficiency and for transistor reliability such as to avoid various breakdown mechanisms.

The system 100 may execute various operations on the memories 101, 102, 104, and 106. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Control signals (CONTROL SIGNALS) 196L, input/output bus (IO BUS) 194L, and ready busy signal (R/BB) 196RB are for communication with the system 100.

A flash power management circuit (FPMU) 198 manages power on-chip such as powering up only the circuit blocks in use. The flash power management circuit 198 also provides isolation between sensitive circuit blocks from the less sensitive circuit blocks by using different regulators for digital power (VDDD)/(VSSD), analog power (VDDA) (VSSA), and IO buffer power (VDDIO)/(VSSIO). The flash power management circuit 198 also provides better process reliability by stepping down power supply VDD to lower levels required by transistor oxide thickness. The flash power management circuit 198 allows the regulation to be optimized for each circuit type. For example, an open loop regulation could be used for digital power since highly accurate regulation is not required; and a closed loop regulation could be used for analog power since analog precision is normally required. The flash power management also enables creation of a "green" memory system since power is efficiently managed.

Figure 2:
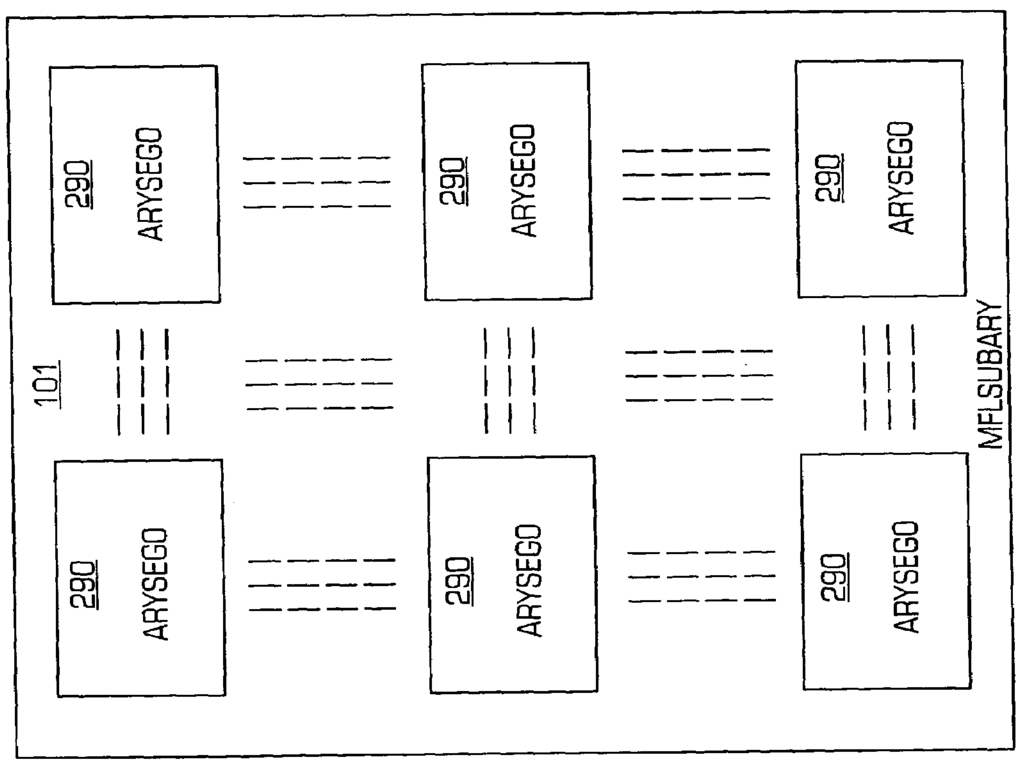
FIG. 2 is a block diagram illustrating a block of a memory array of the digital multilevel memory data storage system of FIG. 1.

FIG. 2 is a block diagram illustrating a block of a memory array 101.

A block (MFLSUBARY) 101 includes a plurality of blocks (ARYSEG0) 290. Blocks (ARYSEG0) 290 are first tiled horizontally NH times and then the horizontally tiled blocks 290 are tiled vertically NV times. For a page with 1024 memory cells, NH is equal to 1024. NV is determined such that the total number of memory cells is equal to the size of the desired physical memory array.

The blocks 290 comprise a plurality of memory arrays that may be arranged in rows and columns. Sense amplifiers may be disposed locally in a block 290 or globally in the memory array 101 or a combination of both.

Figure 3:
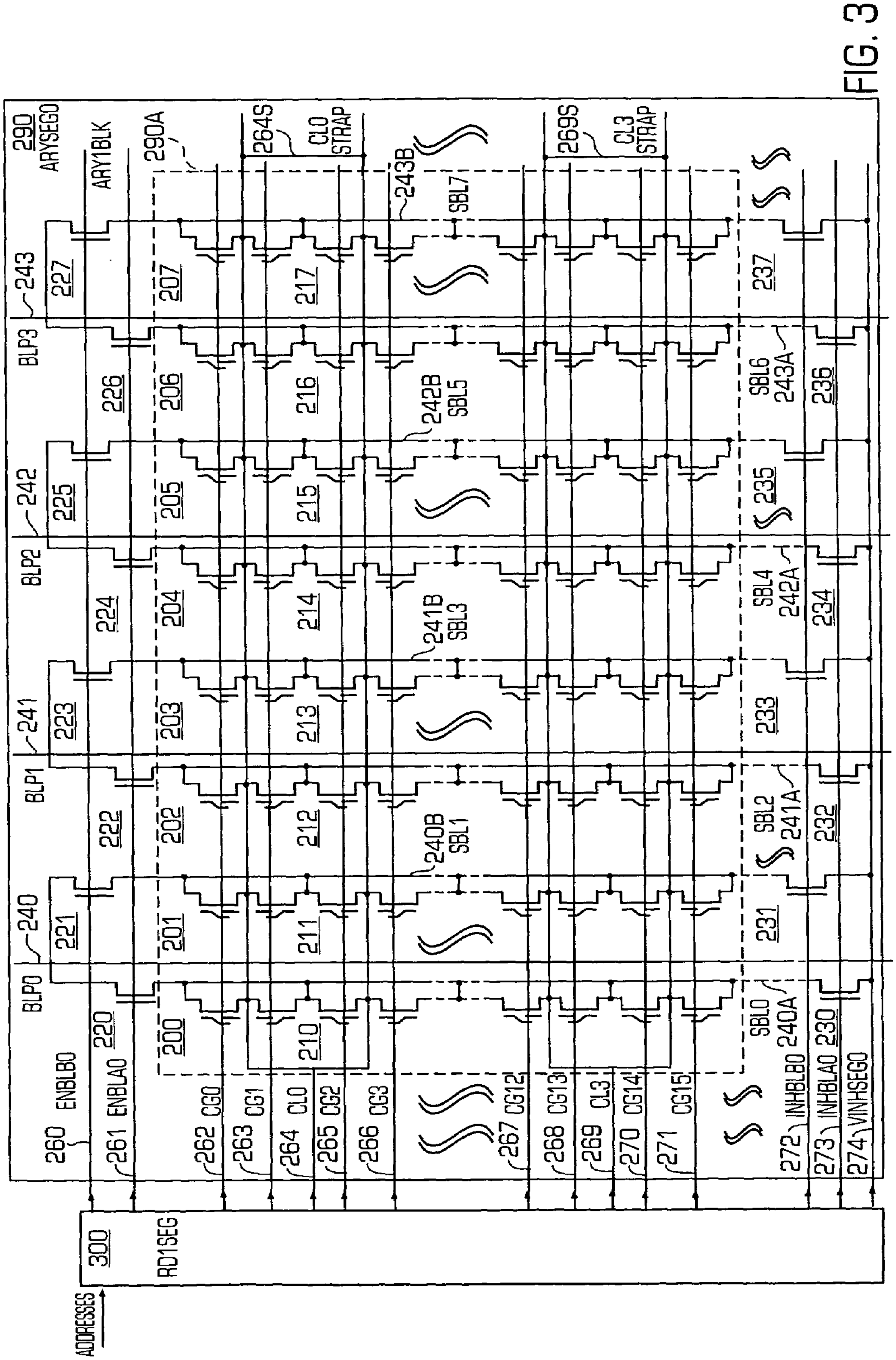
FIG. 3 is a schematic diagram illustrating an array segment of the block of the memory array of FIG. 2.

FIG. 3 is a schematic diagram illustrating an array segment 290.

A plurality of blocks (RD1SEG) 300 are multi-level decoders and comprise a portion of the decoder (MLMDEC) 130 (FIG. 1). In the block (ARYSEG0) 290, there are 8 columns and FIG. 3 shows only 8 rows of memory cells, while other rows, e.g., 120 rows, are not shown for clarity. Each ARYSEG0 290 includes a plurality, e.g. 8, of array blocks (ARYLBLK) 290A tiled vertically. A set of transistors 220, 221, 222, 223, 224, 225, 226, 227 couples a set of segment bitlines (SBL0) 240A and (SBL1) 240B, (SBL2) 241A and (SBL3) 241B, (SBL4) 242A and (SBL5) 242B, (SBL6) 243A and (SBL7) 243B, respectively, to a set of top bitlines (BLP0) 240, (BLP1) 242, (BLP2) 242, and (BLP3) 243, respectively. Top bitlines refer to bitlines running on top of the whole array and running the length of the MFLSUBARY 101. Segment bitlines refer to bitlines running locally within a basic array unit ARYSEG0 290. A set of transistors 230, 231, 232, 233, 234, 235, 236, 237 couples respectively segment bitlines (SBL0) 240A and (SBL1) 240B, (SBL2) 241A and (SBL3) 241B, (SBL4) 242A and (SBL5) 242B, (SBL6) 243A and (SBL7) 243B to an inhibit line (VINHSEG0) 274. A line (CL0) 264 is the common line coupled to common lines of the first four rows of memory cells. A line (CL3) 269 couples to common lines of the last four rows of memory cells. A set of control gates (CG0) 262, (CG1) 263, (CG2) 265, (CG3) 266 couples to control gates of memory cells of the first four rows respectively. A set of control gates (CG12) 267, (CG13) 268, (CG14) 270, (CG15) 271 couples to control gates of memory cells of the last four rows, respectively. A pair of inhibit select lines INHBLB0 272 and INHBILB1 273 couples to gates of transistors 231, 233, 235, 237 and transistors 230, 232, 234, 236 respectively. A pair of bitline select lines (ENBLB0) 260 and (ENBLA0) 261 couples to gates of transistors 221, 223, 225, 227 and transistors 220, 222, 224, 226, respectively.

Multiple units of the basic array unit (ARYSEG0) 290 are tiled together to make up one sub-array (MFLSUBARY) 101 as shown in FIG. 2. And multiples of such (MFLSUBARY) 101 are tiled horizontally to make up the final 8192 columns for a total of 32768'8192=268,435,460 physical memory cells, or called 256 mega cells. The logical array size is 256 mega cells x 4 bits per cell=1 giga bits if 4-bit digital multilevel memory cell is used or 256 mega cells×8 bits per cell=2 giga bits if 8-bit digital multilevel memory cell is used. The top bitlines (BLP0) 240, (BLP1) 241, (BLP2) 242, and (BLP3) 243 run from the top of the array to the bottom of the array. The segment bitlines (SBL0) 240A, (SBL1) 240B, (SBL2) 241A, (SBL3) 241B, (SBL4) 242A, (SBL5) 242B, (SBL6) 243A, and (SBL7) 243B only run as long as the number of rows within a segment, for example, 128 rows. Hence the capacitance contributed from each segment bitline is very small, e.g., 0.15 pF.

The layout arrangement of the top bitlines 240–243 in relative position with each other and with respect to the segment bitlines (SBL0) 240A, (SBL1) 240B, (SBL2) 241 Å, (SBL3) 241B, (SBL4) 242A, (SBL5) 242B, (SBL6) 243A, (SBL7) 243B are especially advantageous in reducing the bitline capacitance. The purpose is to make the top bitlines as truly floating as possible, hence the name of truly-floating-bitline scheme.

Figure 4:
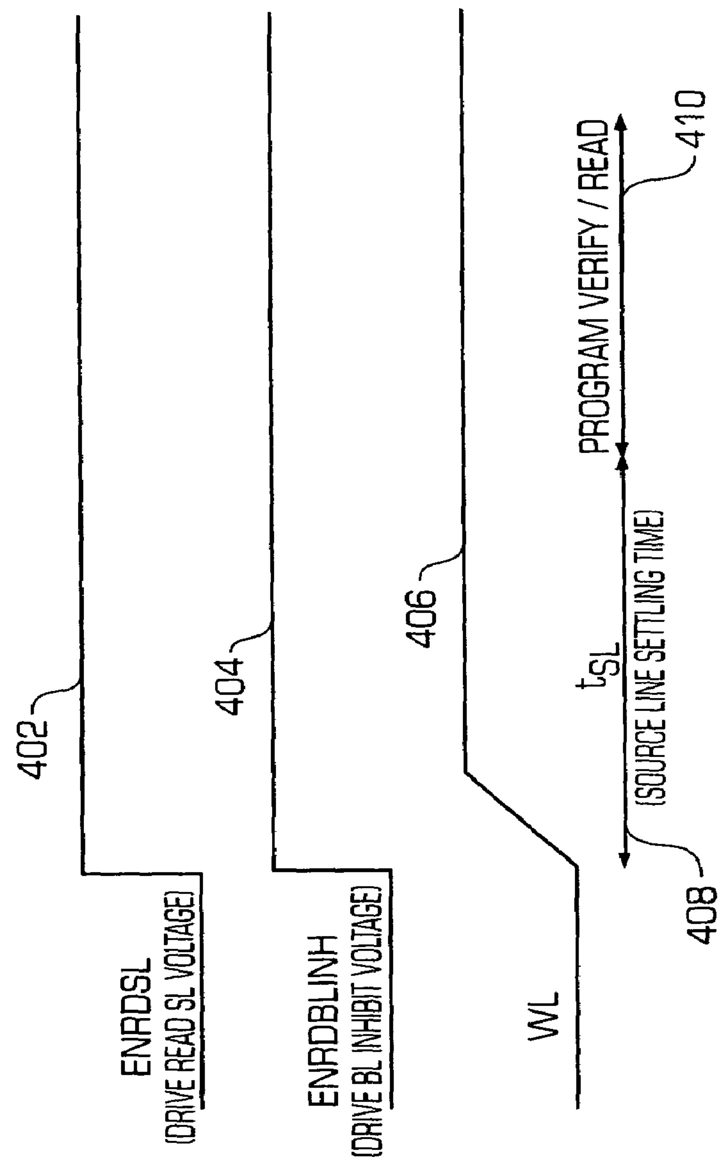
FIG. 4 is a timing diagram illustrating the timing of word line and control signals for reading the memory array of FIG. 1.

FIG. 4 is a timing diagram illustrating the timing of word line and control signals for reading of the memory array system 100.

In this embodiment, a drive read source line voltage (ENRDSL) signal 402 and a drive bitline inhibit voltage (ENRDBLINH) signal 404 are generated and switched by the voltage algorithm controller 176 (FIG. 1), and the voltage 406 on the word line ramps up with a rise time as shown. To ensure that the ramp up of the voltage 406 is complete before performing a program verify or read, a source line settling time ($t_{SL}$) 408 is imposed to allow settling of the word line voltage 406 before a program verify and read period 410.

Figure 5:
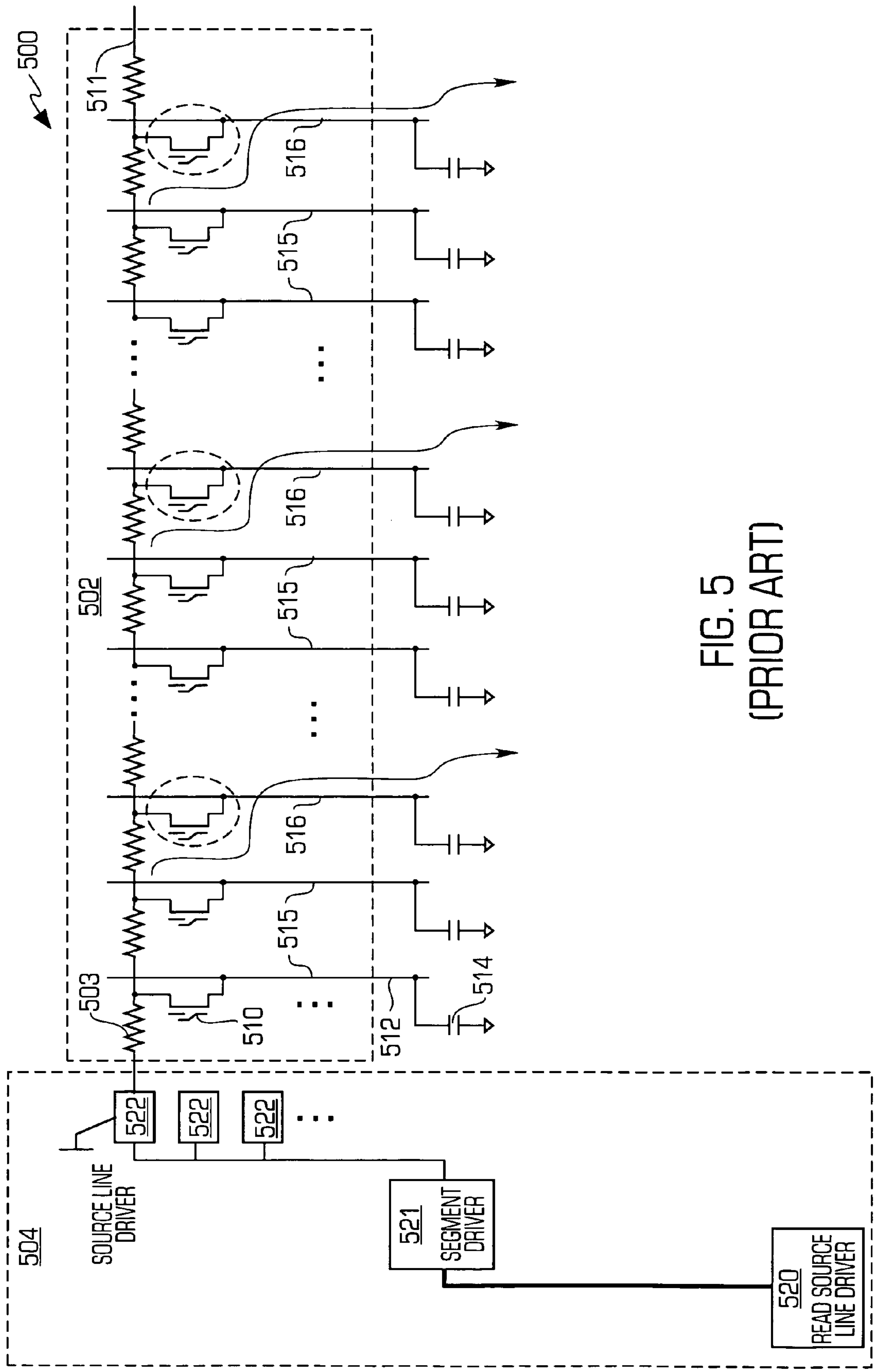
FIG. 5 is a block diagram illustrating a portion of a conventional memory array.

FIG. 5 is a block diagram of a portion of a conventional memory array system 500.

The system 500 comprises a memory 502 and a source line driver circuit 504. The memory 502 may be a portion of one of the arrays, such as the regular memory arrays 101, the redundant memory arrays 102, the spare array 104 or the reference array 106 (FIG. 1). The memory 502 comprises a plurality of memory cells 510 arranged in rows and columns (for simplicity and clarity only one row is shown). A row of memory cells 510 is coupled to a corresponding source line 511. A column of memory cells 510 is coupled to a corresponding bit line 512. (For clarity and simplicity, only one cell 510 and one bitline 512 are numbered in FIG. 5.) Resistance on the source line 511 is shown schematically as a plurality of line resistors 513 coupled in series with the source of the memory cells coupled to a corresponding node formed between two resistors 513. Capacitance on the bit line 512 is shown schematically as a capacitor 514.

The source line driver circuit 504 comprises a read source line driver 520, a segment driver 521, and a plurality of source line drivers 522. The source line driver circuit 504 in conjunction with the decoders 130 and 134 (FIG. 1) apply the source line voltages for programming, verifying, erasing and reading. The read source line driver 520 provides the control voltages to one of the selected segment drivers 521 (only one segment driver 521 is shown in FIG. 5 for simplicity and clarity). The segment driver 521 provides the control voltages to a selected source line driver 522 for application of an appropriate voltage to a selected source line 511.

During a voltage mode multilevel chip read, the source line driver 522 drives the selected source line 511 to an accurate voltage and the selected bitline 516 of the bitlines 512 is biased with the bias current to sense either directly or indirectly the voltage appearing on the bitline 516. Because the unselected cells 510 on the same source line 511 may not all be off but instead may be at different programming states depending on the data stored, the driven source line 511 may see the capacitance of the capacitor 514 on unselected bitlines 515 of the bitlines 512. This capacitance may be very substantial for large arrays and may substantially increase the settling time of the source line 511.

Figure 6:
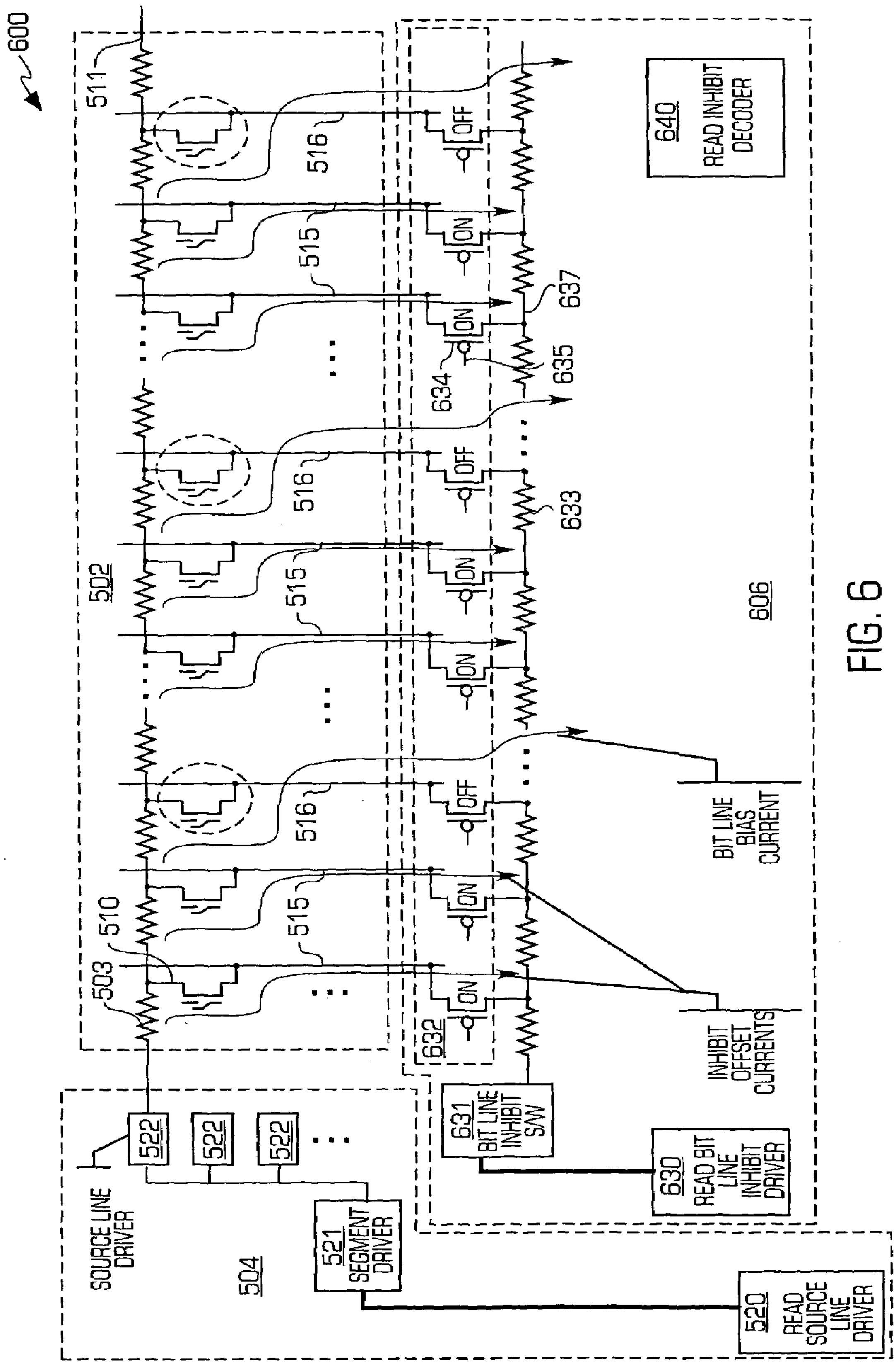
FIG. 6 is a block diagram illustrating a portion of a first embodiment of the block of the memory array of FIG. 1.

FIG. 6 is a block diagram illustrating a portion of a first embodiment of the memory array system 100.

The system 600 comprises a memory 502, a source line driver circuit 504, and a read bitline inhibit circuit 606. The read bitline inhibit circuit 606 comprises a read bitline inhibit driver 630, a bitline inhibit switch 631, a bitline inhibit switch circuit 632, and a read inhibit decoder 640. The bitline inhibit switch 631 couples the read bit line inhibit driver 630 to a replica source line 637. The bitline inhibit switch circuit 632 drives the bitlines 512 through the replica source line 637. Resistance on the replica source line 637 is shown schematically as a plurality of line resistors 633 coupled in series.

The bitline inhibit switch circuit 632 comprises a plurality of switches 634 coupled between a corresponding bitline 512 and the replica source line 637, with the source of the transistor 634 coupled to a node formed between two line resistors 633. The switches 634 may be, for example, a PMOS transistor. The switch is enabled by a selection signal 635 from the read inhibit decoder 640.

The bitline inhibit switch circuit 632 turns on the switches 634 for the unselected bitlines 515 which are the bitlines 512 of the memory cells 510 that are not being read. The read bitline inhibit circuit 606 drives the unselected bitlines 515 to charge the unselected bitlines 515 to a voltage close to the voltage of the source line 511. Because the unselected bitlines 515 are charged by a different source (namely, the read bitline inhibit circuit 606) than the source line 511, the settling time for the source line 511 is reduced.

Conventional memory systems do not match the point voltage appearing across individual unselected cells along the entire source line. Because the unselected cells are not all off and present variable resistance paths depend on their program states, inhibit current loops are created. The inhibit current loops cause localized currents to flow through the source line and cause the source line voltage at any particular selected cell along the source line to vary from the voltage driven by the source line driver. In a voltage mode read, the actual voltage sensed at the selected bit line depends on the source line voltage appearing on the source of any particular cell, due to source line coupling. Thus, the voltage at the source of any particular cell should be the same during read as it was during program verify. Program verify are the algorithmic reads which are done while gradually programming the cell to reach a particular sense level. The pattern stored in the unselected cells during the program verify event can be different from the data stored in the unselected cells during read. Because the data is different, the inhibit current loops changes and causes the actual source voltage appearing at a particular cell along the source line to change. This causes a data pattern sensitivity issue for sensing and cause the read data to be corrupted.

The read bitline inhibit circuit 606 provides a voltage on the unselected bitlines to more quickly charge the bitlines and thereby match the voltage on the unselected cells to that of the selected cells. This reduces inhibit current loops and thereby reduces data dependency of reads. Because the source line voltage drops along the actual source line 511 cannot be completely matched with the replica source line voltage drops when driven actively, data dependency may not be entirely eliminated.

Figure 7:
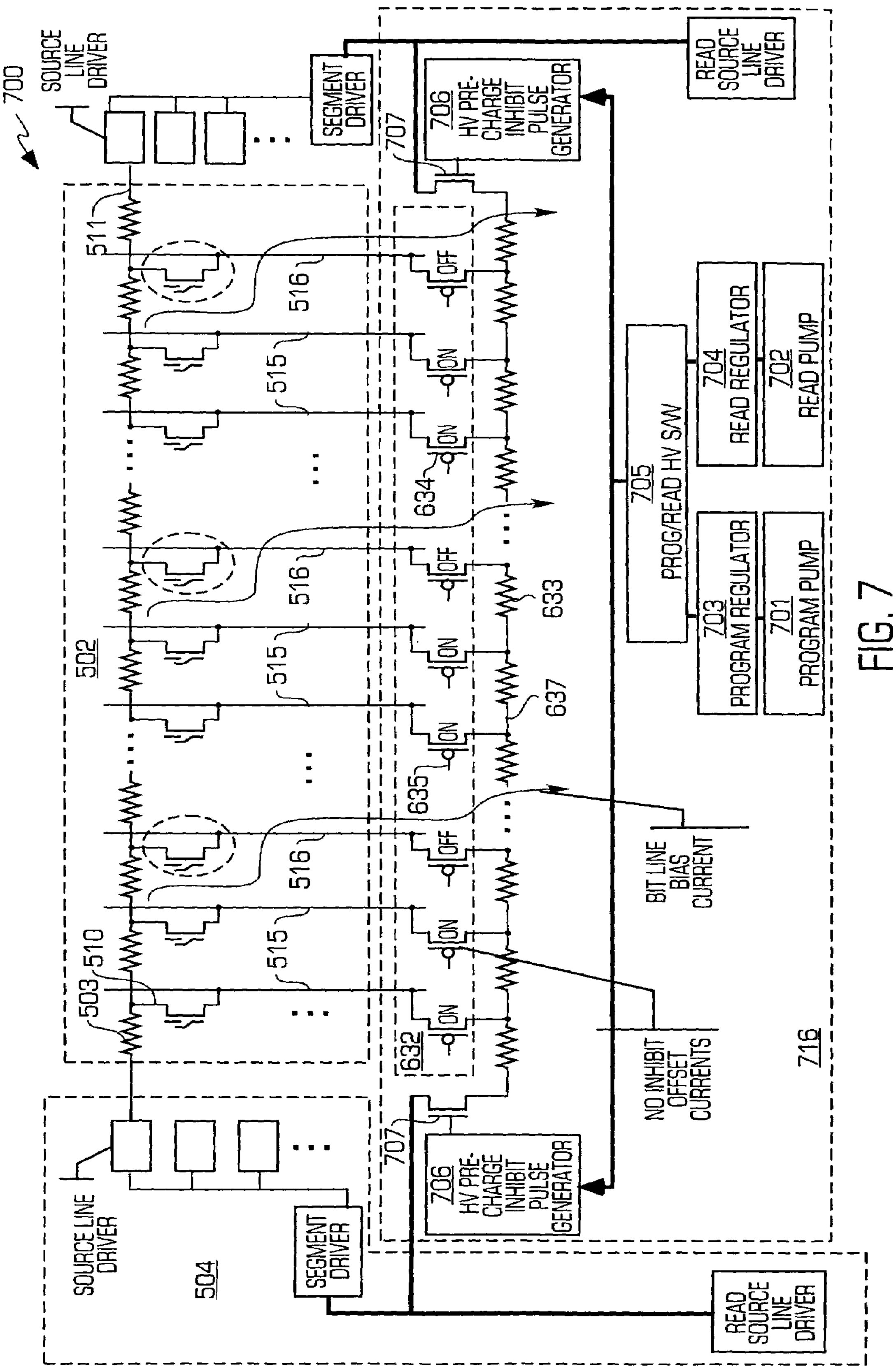
FIG. 7 is a block diagram illustrating a portion of a second embodiment of the block of the memory array of FIG. 1.

FIG. 7 is a block diagram illustrating a portion of a second embodiment of the memory array system 100.

A memory array system 700 comprises a memory 502, a source line driver circuit 504, and a read bitline inhibit circuit 716. The read bitline inhibit circuit 716 comprises a program charge pump 701, a read charge pump 702, a program voltage regulator 703, a read voltage regulator 704, a program read high voltage switch 705, a plurality of high voltage pre-charge inhibit pulse generators 706, and a plurality of NMOS transistors 707. The program charge pump 701 provides a high voltage signal to the program voltage regulator 703 which regulates the voltage applied to the program/read high voltage switch 705. The read charge pump 702 generates a high voltage signal that is regulated by the read voltage regulator 704 and which is applied to the program/read high voltage switch 705. The program/read high voltage switch 705 applies the selected high voltage signals for programming or reading to the high voltage pre-charge inhibit pulse generators 706.

The read bitline inhibit circuit 716 further comprises a bitline inhibit switch circuit 632 and a replica source line 637. The NMOS transistor 707 includes source-drain terminals coupled between the input of the segment driver 521 of the source line driver circuit 502 and the replica source line 637, and includes a gate coupled to the output of the high voltage pre-charge inhibit pulse generators 706. In response to a high voltage pulse from the high voltage pre-charge inhibit pulse generator 706, the NMOS transistor 707 applies the drive signal applied to the segment drivers 521 to the replica source line 637.

The operation of the systems of FIGS. 6 and 7 are now described. The system 600 and 700 eliminate the inhibit current loops during the program verify event and during a read and thereby eliminate a data pattern sensitivity from inhibit currents. The same driver 606 or 706 is used to match the driven voltages, particularly driving both the selected source line and the unselected bitlines 515 during an initial initialization event. For the system of FIG. 7, during the initialization event, the high voltage pre-charge inhibit pulse generator 706 applies a high voltage pulse to the gate of the NMOS transistor 707 to provide a low resistance path to the unselected bitlines 515. The program/read high voltage switch 705 selectively couples the program voltage regulator 703 or the read voltage regulator 704, which provide the regulated program high voltage and the regulated read high voltage, respectively, to the pulse generator 706 during a program verify or read, respectively.

During the initialization event, the source line 511 and the unselected bit lines 515 are both pre-charged to the final source line voltage of the source line 637. After the initialization event, the inhibit path is turned off while the source line 511 is still driven to the desired voltage. The replica source line is no longer actively driven, but is instead charged up to the desired voltage level during the read or program verify event. This eliminates data dependent current loops during the read & program verify event while still read inhibiting the unselected bit lines; consequently data dependency is eliminated. The word line is then brought up to a predetermined fixed voltage to turn on the cells. This causes a temporary unsettling of the source line 511 due to charge sharing with the selected bit lines 515. However recovery is fast due to low capacitance of the source line 511.

Figure 8:
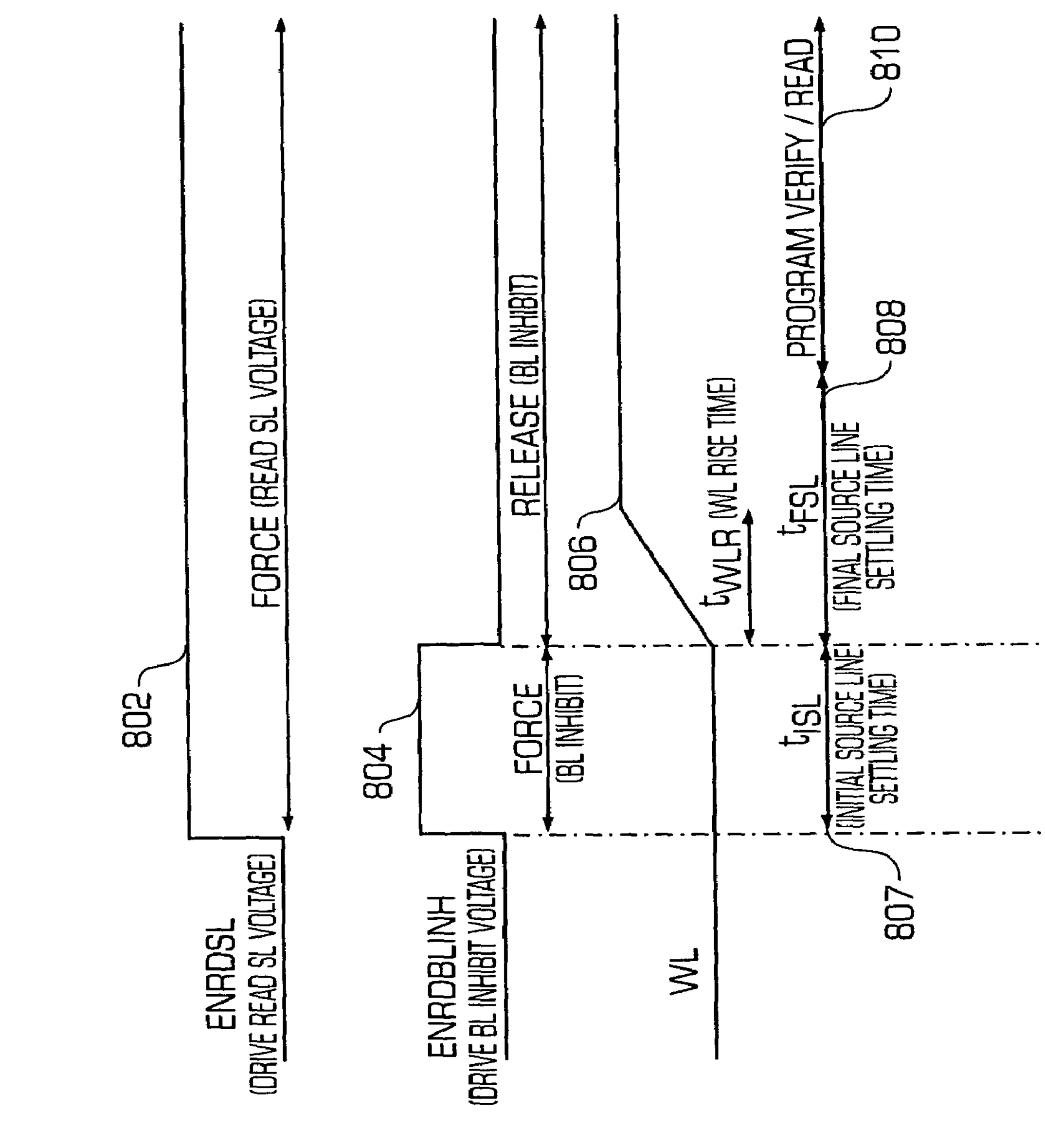
FIG. 8 is a timing diagram illustrating a drive-then-release inhibit procedure for the block of FIG. 7.

FIG. 8 is a timing diagram illustrating a drive-then-release inhibit procedure for the circuit of FIG. 7.

In this embodiment, a drive read source line voltage (ENRDSL) signal 802 and a drive bitline inhibit voltage (ENRDBLINH) signal 804 are switched high. The drive bitline inhibit voltage 804 remains high for a initial source line settling time ($t_{ISL}$) 807 at which the bitline inhibit is forced to a high level. Afterwards the bitline inhibit voltage 804 is then switched low to release the bitline inhibit. In response, the voltage 806 on the word line has a ramp up time or word line rise time ($t_{WLR}$). To ensure that the rise time of the voltage 806 is complete before performing a program verify or read, a final source line settling time ($t_{FSL}$) 808 is imposed to allow settling of the word line voltage 806 before a program verify and read period 810.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A memory system comprising:

a memory array including a plurality of memory cells arranged in rows and columns, a plurality of source lines, and a plurality of bitlines, each of said plurality of source lines being coupled to a corresponding row of memory cells, each of said plurality of bitlines being coupled to a corresponding column of memory cells;

a source line driver circuit selectively coupled to a selected source line to apply a control voltage to said source line; and a read bitline inhibit circuit coupled to the plurality of bitlines to apply inhibit offset voltages to unselected bitlines during a memory operation.

2. The memory system of claim 1 wherein the memory cells are digital multilevel memory cells.

3. The memory system of claim 1 wherein the read bitline inhibit circuit comprises:

a plurality of first transistors, each first transistor including first and second terminals spaced apart with a channel therebetween, and including a gate for controlling current in said channel, said first terminal being coupled to a corresponding bitline, said gate being coupled to a corresponding enable signal, said second terminal being coupled to a replica source line; and a driver circuit for applying voltages to the replica source line to drive inhibit offset voltages on said unselected bitlines that are substantially equal to individual source line node voltage of each unselected memory cell along the source line.

4. The memory system of claim 3 wherein the driver circuit comprises:

a high voltage pre-charge inhibit pulse generator for providing a high voltage signal; and a second transistor including first and second terminals spaced apart with a channel therebetween, and including a gate for controlling current on said channel, said first terminal being coupled to the source line driver circuit, said second terminal being coupled to the replica source line, said gate being coupled to the high voltage pre-charge inhibit pulse generator.

* * * * *